(12) United States Patent
Japp et al.

(10) Patent No.: US 6,838,400 B1
(45) Date of Patent: Jan. 4, 2005

(54) UV ABSORBING GLASS CLOTH AND USE THEREOF

(75) Inventors: Robert Maynard Japp, Vestal, NY (US); Pamela Lulkoski, Vestal, NY (US); Jeffrey McKeveny, Endicott, NY (US); Jan Obrzut, Vestal, NY (US); Kenneth Lynn Potter, Kirkwood, NY (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 09/046,105

(22) Filed: Mar. 23, 1998

(51) Int. Cl.$^7$ .......................... B32B 17/02; B32B 17/04; B32B 27/04
(52) U.S. Cl. ...................... 442/175; 428/901; 428/417; 442/60; 442/172; 442/180; 442/301
(58) Field of Search .................... 442/301, 60, 172, 442/195, 180; 428/901, 417

(56) References Cited

U.S. PATENT DOCUMENTS

| | | | |
|---|---|---|---|
| 3,046,170 A | 7/1962 | Toulmin | 154/43 |
| 3,531,677 A * | 9/1970 | Loughridge | 313/112 |
| 3,650,598 A | 3/1972 | Kitano et al. | 350/96 R |
| 3,671,380 A | 6/1972 | Ali et al. | 161/175 |
| 4,201,606 A | 5/1980 | Neat | 149/37 |
| 4,284,686 A | 8/1981 | Wedding | 428/334 |
| 4,405,672 A | 9/1983 | Araujo et al. | 428/68 |
| 4,444,619 A | 4/1984 | O'Hara | 156/645 |
| 4,697,923 A | 10/1987 | Jones et al. | 356/239 |
| 4,701,425 A | 10/1987 | Baker et al. | 501/70 |
| 4,746,634 A | 5/1988 | Danielson | 501/67 |
| 4,820,326 A | 4/1989 | Speit | 65/30.11 |
| 4,836,837 A | 6/1989 | Rapp | 65/3.3 |
| 4,900,614 A * | 2/1990 | Miyazato et al. | 428/251 |
| 4,906,597 A | 3/1990 | Speit | 501/60 |
| 4,938,602 A | 7/1990 | May et al. | 356/435 |
| 4,980,319 A | 12/1990 | Speit | 501/60 |
| 5,023,210 A | 6/1991 | Krumwiede et al. | 501/71 |
| 5,043,003 A | 8/1991 | Omi et al. | 65/31 |
| 5,077,133 A | 12/1991 | Cheng | 428/426 |
| 5,112,778 A * | 5/1992 | Cheng et al. | 501/31 |
| 5,236,777 A * | 8/1993 | Inoguchi et al. | 428/268 |
| 5,249,076 A | 9/1993 | Fujiwara et al. | 359/350 |
| 5,256,607 A | 10/1993 | Kerko et al. | 501/65 |
| 5,266,385 A | 11/1993 | Ishii | 428/209 |
| 5,281,562 A | 1/1994 | Araujo et al. | 501/32 |
| 5,322,819 A | 6/1994 | Araujo et al. | 501/13 |
| 5,350,972 A | 9/1994 | Bucher et al. | 313/636 |
| 5,362,689 A | 11/1994 | Morimoto et al. | 501/70 |
| 5,364,820 A | 11/1994 | Morimoto et al. | 501/71 |
| 5,403,789 A | 4/1995 | Kerko et al. | 501/65 |
| 5,405,811 A | 4/1995 | Kerko et al. | 501/66 |
| 5,420,082 A * | 5/1995 | Maugendre et al. | 501/35 |
| 5,422,755 A | 6/1995 | Morgan | 359/361 |
| 5,430,573 A | 7/1995 | Araujo et al. | 359/361 |
| 5,433,997 A | 7/1995 | Land | 428/251 |
| 5,728,471 A * | 3/1998 | Dupont et al. | 428/432 |
| 5,942,331 A * | 8/1999 | Miyauchi et al. | 428/328 |

FOREIGN PATENT DOCUMENTS

| | | | |
|---|---|---|---|
| JP | 03-261633 | * | 9/1988 |
| JP | 63-225552 | * | 9/1988 |

OTHER PUBLICATIONS

English language abstract of JP 03–261633A, published by Japanese Abstracts, 1991.*
Haining, FW, "Prepreg Manufacturing Process", *TDB*, Apr. 1978, p. 4723.
Chellis, LN, "Substrate for Surface Solder Devices", *TDB*, Sep. 1984, p. 1964.
"Dry Process for Laminating Boards", *Research Disclosure*, No. 252, Apr. 1985.
"Transmission of Colored Glasses", *Handbook of Chemistry and Physics*, 47th Edition, Robert C. Weast, Editor–in–Chief, The Chemical Rubber Co., 1966, pp. E–158–E–166.

* cited by examiner

Primary Examiner—Cheryl A. Juska
(74) Attorney, Agent, or Firm—Conolly Bove Lodge & Hutz, LLP; Arthur J. Samodovitz

(57) ABSTRACT

The glass transmittance of UV light having a wavelength of 365 nanometers is reduced by compounding an oxide or salt of at least one of Fe, Cu, Cr, Ce, Mn and mixtures thereof. The fiberglass cloth can be used for providing reinforced prepregs used in producing printed circuit boards or laminated chip carrier substrates.

18 Claims, No Drawings

UV ABSORBING GLASS CLOTH AND USE THEREOF

TECHNICAL FIELD

The present invention is concerned with weavable glass fibers that absorb UV light. The fiberglass cloth of the present invention is especially useful as reinforcing material for substrates employed in fabricating printed circuit boards and cards. More particularly, the present invention relates to a fiberglass formulation that includes an oxide or salt of Fe, Cu, Cr, Ce and/or Mn. The woven fiberglass cloth is employed as reinforcing material in fabricating substrates for printed circuit boards and cards and laminated chip carrier packages (LCCs).

BACKGROUND OF INVENTION

The fabrication of printed circuit boards includes producing a prepreg of a fiber sheet such as woven cloth or non-woven fabrics for instance, of glass fiber as a reinforcing material impregnated with a thermosetting synthetic polymer such as an epoxy resin composition or polyimide resin composition. A plurality of such prepregs are laminated and a metal foil is placed on each of the major surfaces of the laminate, and the assembly is then hot pressed.

A circuit wiring is formed on the metal foil on each of the major surfaces of the substrate by photolithographic technique. The photolithographic process involves providing a photoresist that is exposed to UV light for processing. In fabricating the circuits by additive pattern plating, UV light should not be transmitted through the laminate from one side of the printed circuit board to the other side. In particular, stray light transmittance can expose photoresist on the other side of the printed circuit board and can cause defects in the circuitry. Accordingly, various dyes and colored resin additives have been added to the laminate polymer in order to absorb UV light so that it does not pass through the laminate. However, as printed circuit board component cores become thinner and thinner, it has been observed that a light transmittance path has surfaced that formerly was not a problem. In particular, open and near open circuit defects have been observed which are believed to be caused by stray light. Such defects have been located over intersections of the glass cloth weave referred to as knuckles. Knuckles are thicker than surrounding areas of glass cloth and can stack up on top of each other somewhat randomly. Such stacking produces resin poor, vertically oriented zones through which UV light can be transmitted. Furthermore, it has been observed according to the present invention that the glass fibers may act in the nature of a light pipe to collect UV light from non-knuckle areas and transmit it to the surface by a fiber optic-like effect.

Moreover, during additive circuitization processing, bleedthrough has been observed on the first side of the laminate due to UV light from exposure of the second side. It has been believed that the depletion of photoinhibitors and/or oxygen in the first side photoresist from the first side exposure, effectively increases the photospeed of the remaining unexposed first side photoresist. When this sensitized resist sees even a small dose of UV transmitted through the glass knuckles from the second side exposure, it polymerizes, does not develop off and causes defects. As cores become thinner and thinner, the bleedthrough problem adversely affects the photoresist on both sides of the laminate. It would therefore be desirable to provide a process for overcoming these problems.

SUMMARY OF INVENTION

The present invention provides for significantly reducing, if not entirely eliminating, UV light transmission through a reinforced substrate. More particularly, the present invention is concerned with a woven fiberglass cloth which comprises an oxide or salt of Fe, Cu, Cr, Ce and/or Mn. The amount of salt and/or oxide blended or compounded into the fiberglass cloth composition must be sufficient to reduce the glass transmittance of UV light. Typically, the amount is about 0.01% to about 2% by weight of the glass composition.

Furthermore, the present invention is concerned with a fiber reinforced polymer substrate containing the above-disclosed weavable fiberglass cloth impregnated with a thermosetting polymer.

Another aspect of the present invention is concerned with fabricating printed circuit boards which comprises forming a prepreg of a fiber reinforced polymer substrate containing the above-disclosed weavable fiberglass cloth impregnated with a thermosetting polymer, laminating a plurality of prepregs, placing a metal foil on both surfaces of the laminate, and then hot pressing the assembly. Various other conventional fabrication steps can then be performed such as hole drilling, additive, or subtractive circuitization and composite lamination. Next, a solder mask resist is applied and subjected to imagewise irradiation with ultraviolet light in a predetermined pattern for defining the subsequently to be provided solder coated locations.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The present invention is concerned with a woven fiberglass cloth that contains an oxide or salt of at least one member selected from the group consisting of Fe, Cu, Cr, Ce, Mn and mixtures thereof. The oxide and/or salt is present in an amount sufficient to reduce the glass transmittance of UV light having a wavelength of 365 nanometers. In addition, the weavable fiberglass cloth of the present invention is preferably colorless or yellow, but may also be blue, red, green or violet in color, if desired.

Typically, the amount of the oxide and/or salt is about 0.010 to about 2% by weight of the glass formulation. Typical glass compositions containing the modification of the present invention are E glass, S glass or D glass. E-glass typically has the following composition:

| Ingredient | Composition Range |
| --- | --- |
| Silicon dioxide | 52–56% |
| Calcium dioxide | 16–25% |
| Aluminum oxide | 12–16% |
| Boron oxide | 8–13% |

-continued

| Ingredient | Composition Range |
| --- | --- |
| Sodium and potassium oxide | 0–1% |
| Magnesium oxide | 0–6% |

To the above composition is added 0.01 to about 2% by weight of the oxide and/or salt according to the present invention. A preferred additive is potassium bichromate ($K_2Cr_2O_7$). The preferred amount of the oxide and/or salt is about 0.05 to about 1% by weight and most preferably about 0.05 to about 0.5% by weight.

The woven fiberglass cloth of the present invention can be used to form prepregs which ultimately are used in providing printed circuit boards. In particular, the fiberglass cloth is impregnated with a curable composition such as an epoxy resin composition. Suitable epoxy resin compositions are those disclosed in U.S. Pat. Nos. 3,523,037; 4,550,128; 4,597,996 and 5,143,756; disclosures of which are incorporated herein by reference. The impregnated fiberglass is heated to partially cure the epoxy resin, after which a plurality of prepregs are laminated. On at least both of the major surfaces of the laminate, a metal foil such as an electrolytic copper foil is provided. The assembly of prepregs and metal plates and copper foils is then placed between platens of a laminating press. The platens are cored for steam or superheated water so that they can be heated to temperatures of about 350° F. or more. The above assembly is subjected to pressures which may vary from about 100 psi to about 750 psi, depending upon resin content, melt rheology of the prepreg and laminating temperatures. The laminate is maintained at this temperature and pressure for a time sufficient to cause flow of the resin and complete the curing to a degree where the desired laminate properties are obtained. Typical cure times and temperatures vary from about 30 minutes to about 120 minutes at about 150° C. to 250° C.

Other resin types such as polyimides, cyanate esters, fluoropolymers, benzocyclobutenes, polyphenylenesulfide, polysulfones, polyetherimides, polyetherketones, polyphenyquinoxalines, polybenzoxazoles, and polyphenylbenzobistbiazoles, or thermoplastics such as polyester are also suitable for use with the current invention.

The desired circuit wiring is formed on the metal foil on each of the major surfaces of the substrate by a photoresist method whereby a resist cured pattern is provided thereon by a photoresist method to produce the desired printed wiring circuit. In order to obtain a resist cured pattern, both surfaces can be irradiated with ultraviolet light at the same time. According to the present invention, light is not permitted to transmit through the laminate to the other side.

The following non-limiting examples are presented to further illustrate the present invention.

COMPARISON EXAMPLE 1

Circuit board signal cores containing three plys of standard 1080 glass cloth are additive circuitized and inspected. Semi-periodic opens and near opens defects are found. Further investigation indicates that these defects are caused by residual photo resist located in the developed circuit line channels and that each is located over a cloth knuckle in the laminate under the channel. A knuckle is the intersection in the warp and fill yarns of the glass cloth. The core laminate contains standard 1080 glass cloth, and an epoxy resin containing 6% tetra functional UV absorbing epoxy. From the above experiments it is concluded that the knuckle areas are allowing transmission of UV light through to the other side of the signal core during expose. Knuckle areas are composed of approximately only 33% by volume resin while window areas (the glass fiber free spaces between fiber bundles), contain 100 resin.

Transmitted UV light intensity is then measured thru the above.

| Laminate tested | intensity |
| --- | --- |
| No laminate | 25.5000 |
| 3 ply 1080 (low PU) | .0343 |
| 1080/106/1080 (normal PU) | .0234 |
| 3 ply 1080 (normal PU) | .0125 |

Because defects caused by light transmission only occur above cloth knuckles and not in window areas, it can be concluded that all of the stray light measured above is being transmitted through the knuckles. It should be noted that the intensity readings above are averages collected over areas approximately 0.80 inches square of which knuckle areas constitute approximately 25%, so the actual light intensity coming through the knuckles is approximately 400% higher than shown above. This "percent knuckle area" is different for other glass cloth styles.

COMPARISON EXAMPLE 2

Since knuckle areas do contain some resin, an attempt is made to reduce the UV transmission through them by increasing both the resin to glass ratio and the level of tetra functional, UV absorbing epoxy resin component within the bulk epoxy formulation.

Prepegs are made using standard 1080 style glass cloth. The prepegs are made using three different levels of tetra functional epoxy resin additive. This tetra functional epoxy is the yellow colored UV absorbing component which is normally added to laminate epoxies. The following table shows that although the additional tetra functional additive does reduce intensity of the transmitted UV light, the reduction is not enough to prevent bleedthrough above the glass cloth knuckles.

| Laminate | UV reading (UW/Cm2) | Bleedthrough | Thickness (mils) |
| --- | --- | --- | --- |
| Epoxy +6% | | | |
| 1 ply | 152.3 | yes | 3.8 |
| 2 plys | 38.4 | yes | 5.6 |
| 3 plys | 14.2 | yes | 7.0 |
| Epoxy +8% | | | |
| 1 ply | 108.4 | yes | 3.8 |
| 2 plys | 25.4 | yes | 5.5 |
| 3 plys | 8.4 | yes | 6.5 |
| Epoxy +10% | | | |
| 1 ply | 56.5 | yes | 3.8 |
| 2 plys | 11.4 | yes | 5.3 |
| 3 plys | 3.5 | yes | 7.0 |

EXAMPLE 3

A laminate containing FR-4 epoxy resin and a plurality of glass fibers constituting 29% by volume is prepared. The glass fibers are made from a bulk E-glass melt which contains about 0.05 to about 0.5% potassium bichromate. After fiberization, the chrome doped fibers are woven using the standard weaving processes into standard 1080 style glass cloth and treated with the standard silane glass cloth finishing treatments. This cloth is then impregnated with epoxy resin such that the epoxy constitutes approximately 71% by volume of the laminate and the glass 29% by volume. The laminate thus containing glass cloth with enhanced UV absorption exhibits improved resistance to UV bleedthrough above the glass cloth knuckles when subjected to additive circuitization.

EXAMPLE 4

A laminate containing FR-4 epoxy resin and a plurality of glass fibers constituting 29% by volume is prepared. The glass fibers are made from a bulk E-glass melt which contains about 0.1 to about 1% manganese dioxide. After fiberization, the manganese doped fibers are woven using the standard weaving processes into standard 1080 style glass cloth and treated with the standard silane glass cloth finishing treatments. This cloth is then impregnated with epoxy resin such that the epoxy constitutes approximately 71% by volume of the laminate and the glass 29% by volume. The laminate thus containing glass cloth with enhanced UV absorption exhibits improved resistance to UV bleedthrough above the glass cloth knuckles when subjected to additive circuitization.

EXAMPLE 5

A laminate containing FR-4 epoxy resin and a plurality of glass fibers constituting 29% by volume is prepared. The glass fibers are made from a bulk E-glass melt which contains about 0.1 to about 1% cerium dioxide. After fiberization, the cerium doped fibers are woven using the standard weaving processes into standard 1080 style glass cloth and treated with the standard silane glass cloth finishing treatments. This cloth is then impregnated with epoxy resin such that the epoxy constitutes approximately 71% by volume of the laminate and the glass 29% by volume. The laminate thus containing glass cloth with enhanced UV absorption exhibits improved resistance to UV bleedthrough above the glass cloth knuckles when subjected to additive circuitization.

EXAMPLE 6

A laminate containing FR-4 epoxy resin and a plurality of glass fibers constituting 29% by volume is prepared. The glass fibers are made from a bulk E-glass melt which contains about 0.05 to about 0.5% copper oxide. After fiberization, the copper doped fibers are woven using the standard weaving processes into standard 1080 style glass cloth and treated with the standard silane glass cloth finishing treatments. This cloth is then impregnated with epoxy resin such that the epoxy constitutes approximately 71% by volume of the laminate and the glass 29% by volume. The laminate thus containing glass cloth with enhanced UV absorption exhibits improved resistance to UV bleedthrough above the glass cloth knuckles when subjected to additive circuitization.

EXAMPLE 7

A laminate containing FR-4 epoxy resin and a plurality of glass fibers constituting 29% by volume is prepared. The glass fibers are made from a bulk E-glass melt which contains about 0.05 to about 0.5% iron oxide. After fiberization, the iron doped fibers are woven using the standard weaving processes into standard 1080 style glass cloth and treated with the standard silane glass cloth finishing treatments. This cloth is then impregnated with epoxy resin such tat the epoxy constitutes approximately 71% by volume of the laminate and the glass 29% by volume. The laminate thus containing glass cloth with enhanced UV absorption exhibits improved resistance to UV bleedthrough above the glass cloth knuckles when subjected to additive circuitization.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A woven fiberglass cloth comprising an oxide or salt of at least one member selected from the group consisting of Cu, Cr, and mixtures thereof in an amount sufficient to reduce the glass transmittance of UV light having a wavelength of 365 nanometers; and wherein the oxide or salt is present in an amount of about 0.01 to 2% by weight of the fiberglass cloth; and wherein the oxide or salt is incorporated in a glass composition selected from the group consisting of D glass, S glass and E glass.

2. The woven fiberglass cloth of claim 1 wherein the amount of said oxide or salt is 0.05 to about 1% by weight based upon the weight of the fiberglass cloth.

3. The woven fiberglass cloth of claim 1 which comprises potassium bichromate.

4. The woven fiberglass cloth of claim 1 wherein said glass is E glass.

5. The woven fiberglass cloth of claim 1 wherein said cloth is yellow or colorless.

6. The woven fiber of claim 1 wherein the amount of the oxide or salt is about 0.05 to about 0.5% by weight.

7. The woven fiberglass cloth of claim 1 which comprises an oxide or salt of Cr.

8. The woven fiberglass cloth of claim 1 which comprises an oxide or salt of Cu.

9. The woven fiberglass cloth of claim 1 which comprises copper oxide.

10. A fiber reinforced plastic comprising the woven fiberglass cloth of claim 1 and a synthetic resin.

11. The fiber reinforced plastic of claim 10 wherein said resin is an epoxy composition.

12. The fiber reinforced plastic of claim 10 wherein the amount of said oxide or salt is 0.05 to about 1% by weight based upon the weight of the fiberglass cloth.

13. The fiber reinforced plastic of claim 10 which comprises potassium bichromate.

14. The fiber reinforced plastic of claim 10 wherein said glass is E glass.

15. The fiber reinforced plastic of claim 10 wherein the amount of the oxide or salt is about 0.05 to about 0.5% by weight.

16. The fiber reinforced plastic of claim 10 which comprises an oxide or salt of Cr.

17. The fiber reinforced plastic of claim 10 which comprises an oxide salt of Cu.

18. The fiber reinforced plastic of claim 10 which comprises copper oxide.

* * * * *